(12) United States Patent
Bouisse

(10) Patent No.: US 9,041,465 B2
(45) Date of Patent: May 26, 2015

(54) AMPLIFIER CIRCUITS

(71) Applicant: NXP B.V., Eindhoven (NL)

(72) Inventor: Gerard Jean-Louis Bouisse, Toulouse (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/444,063

(22) Filed: Jul. 28, 2014

(65) Prior Publication Data

US 2015/0048884 A1 Feb. 19, 2015

(30) Foreign Application Priority Data

Aug. 14, 2013 (EP) .................................... 13290190

(51) Int. Cl.
*H03F 3/45* (2006.01)
*H03F 3/16* (2006.01)
*H01L 27/07* (2006.01)
*H03F 3/193* (2006.01)
*H01L 29/78* (2006.01)
*H03F 3/21* (2006.01)

(52) U.S. Cl.
CPC ........ *H03F 3/45179* (2013.01); *H01L 27/0705* (2013.01); *H03F 3/193* (2013.01); *H03F 3/45* (2013.01); *H01L 29/7817* (2013.01); *H03F 3/21* (2013.01); *H03F 2003/45008* (2013.01); *H03F 2203/45356* (2013.01); *H03F 3/45183* (2013.01); *H03F 2203/45481* (2013.01)

(58) Field of Classification Search
CPC .................................................. H03F 3/45179
USPC ......................................... 330/253, 255, 261
See application file for complete search history.

(56) References Cited

U.S. PATENT DOCUMENTS 8,698,562 B2 * 4/2014 Kondo et al. ................. 330/276
2002/0145184 A1 10/2002 Perugupalli et al.
2005/0083133 A1 4/2005 Amano

FOREIGN PATENT DOCUMENTS

EP          1 748 487 A2    1/2007
EP          2 600 525 A2    6/2013
WO          2010/038111 A1  4/2010
WO          2010/125431 A1  11/2010

OTHER PUBLICATIONS

Cheng et al., "A NEw Approach to Realize High Performance RF Power FETs on Si(11) Surface", 39th IEEE annual power electronics specialists conference, pp. 3854-3856.*
Extended European Search Report for Application No. 13290190.1 (Apr. 2, 2014).
Fiorenza, James G. et al; "Technologies for RF Power LDMOSFETs Beyond 2 GHz: Metal/ploy-Si Damascene Gates and Low-Loss Substrates"; International IEDM Meeting; 4 pages (Dec. 2002).
Communication pursuant to Article 94(3) EPC for application EP 13 290 190.1 (Mar. 13, 2015).

* cited by examiner

*Primary Examiner* — Evan Pert

(57) ABSTRACT

Differential amplifier circuits for LDMOS-based amplifiers are disclosed. The differential amplifier circuits comprise a high resistivity substrate and separate DC and AC ground connections. Such amplifier circuits may not require thru-substrate vias for ground connection.

13 Claims, 6 Drawing Sheets

AMPLIFIER CIRCUITS

CROSS-REFERENCE TO RELATED APPLICATIONS

This application claims the priority under 35 U.S.C. §119 of European patent application no. 13290190.1, filed on Aug. 14, 2013, the contents of which are incorporated by reference herein.

This invention relates to the field of amplifier circuits, and more particularly to differential amplifier circuits for laterally diffused metal oxide semiconductor (LDMOS) amplifiers.

LDMOS Power amplifier circuits are widely used in Radio Frequency (RF) applications. Conventional LDMOS devices (including LDMOS power amplifiers) typically employ a low resistivity substrate having a resistivity around or below 10 mΩ*cm. The usage of a low resistivity substrate limits LDMOS performance.

Use of higher resistivity substrates can provide improvement in maximum frequency and power performance roll-off of an active LDMOS device and significant improvement in passive LDMOS devices (such as inductors and transmission lines, for example). Consequently, there has been a drive to employ higher resistivity substrates in LDMOS devices.

However, known techniques for employing higher resistivity substrates in LDMOS devices require the use of thru-substrate vias for grounding connections to be made. Such vias are complicated and expensive to implement. Nonetheless, due to the performance benefits of employing higher resistivity substrates in LDMOS devices, considerable investment and development work has been undertaken (and is currently on going) in order to optimise the use of such thru-substrate vias in higher resistivity substrates.

According to an aspect of the invention there is provided a differential amplifier circuit for an LDMOS-based amplifier, the circuit comprising a high resistivity substrate and separate DC and AC ground connections.

Proposed is a differential amplifier circuit that employs a high resistivity substrate. When compared to using a conventional low resistivity substrate, use of a high resistivity substrate provides an improvement in maximum frequency and power performance roll-off of an active device and significant improvement in passive devices (such as inductors and transmission lines, for example). Further, unlike conventional circuits that employ a high resistivity substrate, the proposed amplifier circuit may not require thru-substrate vias for ground connection. Embodiments may therefore enable the use of a high resistivity silicon substrate without the need for expensive thru-silicon via holes. Such embodiments may be useful for future generations of LDMOS technologies, especially since conventional LDMOS technologies are such that little improvement can currently be realised in active or passive devices due to RF losses in the low resistivity silicon substrates that are typically employed.

For the purpose of improved understanding, high resistivity is considered as around 50 Ω*cm or above, preferably 100 Ω*cm or above, and even more preferably 1KΩ*cm or above. Conversely, low resistivity is considered to be around or below 10 mΩ*cm. Thus, embodiments may employ a high resistivity substrate having a resistivity that is several orders of magnitude greater than the resistivity (10 mΩ*cm or below) of a conventional low resistivity substrate.

By enabling the use of a high resistivity silicon substrate without the need for thru-silicon via holes for ground connection(s), embodiments may reduce RF substrate losses whilst avoiding the need for complex and expensive thru-substrate via manufacturing Embodiments employing a high resistivity substrate may provide the following advantages:
- transistor roll-off improvement (higher Ft, constant power density and improved efficiency across a broader frequency range, e.g. extension of the current 1-2 GHz performance up to 3-4 GHz); and
- inductance and transmission lines drastic Q improvement.

Embodiments may employ the concept of splitting the AC and DC grounding connections, wherein the AC ground connections are virtual grounds provided by the differential operation of the circuit, and wherein the DC ground connections physical grounding electrical connections. In this way, thru-substrate vias may not be required for grounding connections.

In embodiment, the virtual ground connection may be provided by a source-to-source connection between two source-connected transistors.

The high resistivity substrate may comprise silicon and may have a resistivity greater than or equal to 50 Ω*cm.

According to an aspect of the invention there is provided a LDMOS-based amplifier comprising a differential amplifier circuit according to an embodiment of the invention.

By way of example, an embodiment of the invention may be employed in an integrated circuit (IC), a monolithic microwave integrated circuit (MMIC), or a high-power RF amplifier circuit. Embodiments may therefore be used in a mobile base station or other devices/systems that may employ RF amplifier circuits, for example.

BRIEF DESCRIPTION OF DRAWINGS

Examples of the invention will now be described in detail with reference to the accompanying drawings, in which:

FIG. 1 is a schematic diagram of a differential (i.e. push-pull) multistage amplifier MMIC 10 for a LDMOS amplifier according to an embodiment of the invention. Here, the circuit 10 is a driver circuit for a 55 dBm P3 dB final stage with 19 dB small signal gain.

The circuit 10 differs from a conventional LDMOS amplifier in that is comprises a high resistivity substrate and ground connections that are split into: AC ground connections; and DC ground connections. The AC ground connections are virtual grounds due to the differential operation of the circuit, whereas the DC ground connections (which can experience parasitic inductance) are realised using physical grounding electrical connections (such as wire bond connections or a microstrip-like connection, for example).

Figure 1:
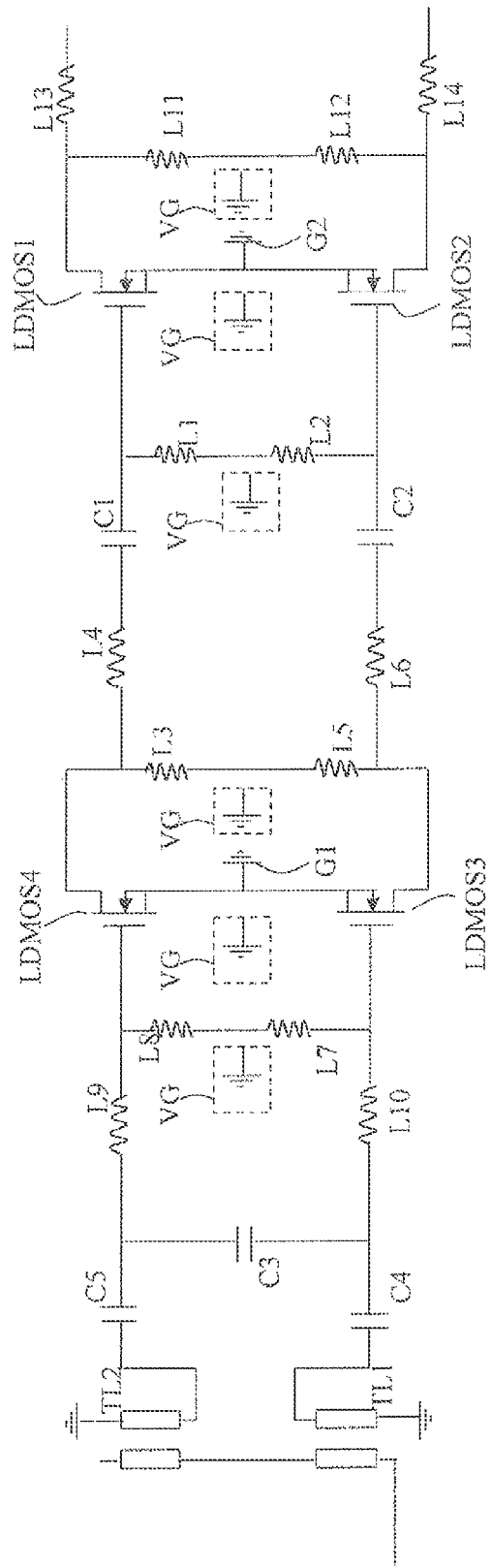
FIG. 1 is a schematic diagram of a differential amplifier circuit for a LDMOS amplifier according to an embodiment of the invention.

The embodiment of FIG. 1 makes use of the realisation that for a differential amplifier circuit the AC (e.g. Radio Frequency) and DC ground connections can be split (e.g. provided separately from each other), thus enabling the AC ground connections to be provided by virtual grounds and the DC ground connections can be obtained with physical (inductive) connections. By splitting the provision of the AC (e.g. Radio Frequency) and DC ground connections, thru-substrate vias are not required for grounding connections.

The notable feature of the circuit 10 of FIG. 1 resides between the source of the source-connected transistors LDMOS1, LDMOS2 and LDMOS3 & LDMOS4. More specifically, this is the location in the circuit where the split between the DC and AC grounding connections is implemented.

Connected to the source of LDMOS1 and LDMOS2 is a first physical ground G1. Thus, the source of each of LDMOS1 and LDMOS2 is DC grounded and, in this example, the grounding connection is made using a plurality of wire bonds connections between source and ground. Such DC grounding connections do not work well for AC (e.g. RF) grounding due of the associated inductance of the wire bonds connections. A source to source connection of LDMOS1 and LDMOS2 is therefore implemented using an intermediate layer of metal to connect the source of LDMOS1 to the source of LDMOS2 such that the mid-point becomes a virtual AC ground VG due to the differential operation of the amplifier circuit.

Similarly, connected to the source of LDMOS3 and LDMO4 is a second physical ground G2. Thus, the source of each of LDMOS3 and LDMOS4 is DC grounded, again in this example, using a plurality of wire bonds connections between source and ground. A source to source connection of LDMOS3 and LDMOS4 is also implemented using an intermediate layer of metal to connect the source of LDMOS3 to the source of LDMOS4 such that the mid-point becomes a virtual AC ground VG due to differential operation.

Figure 2:
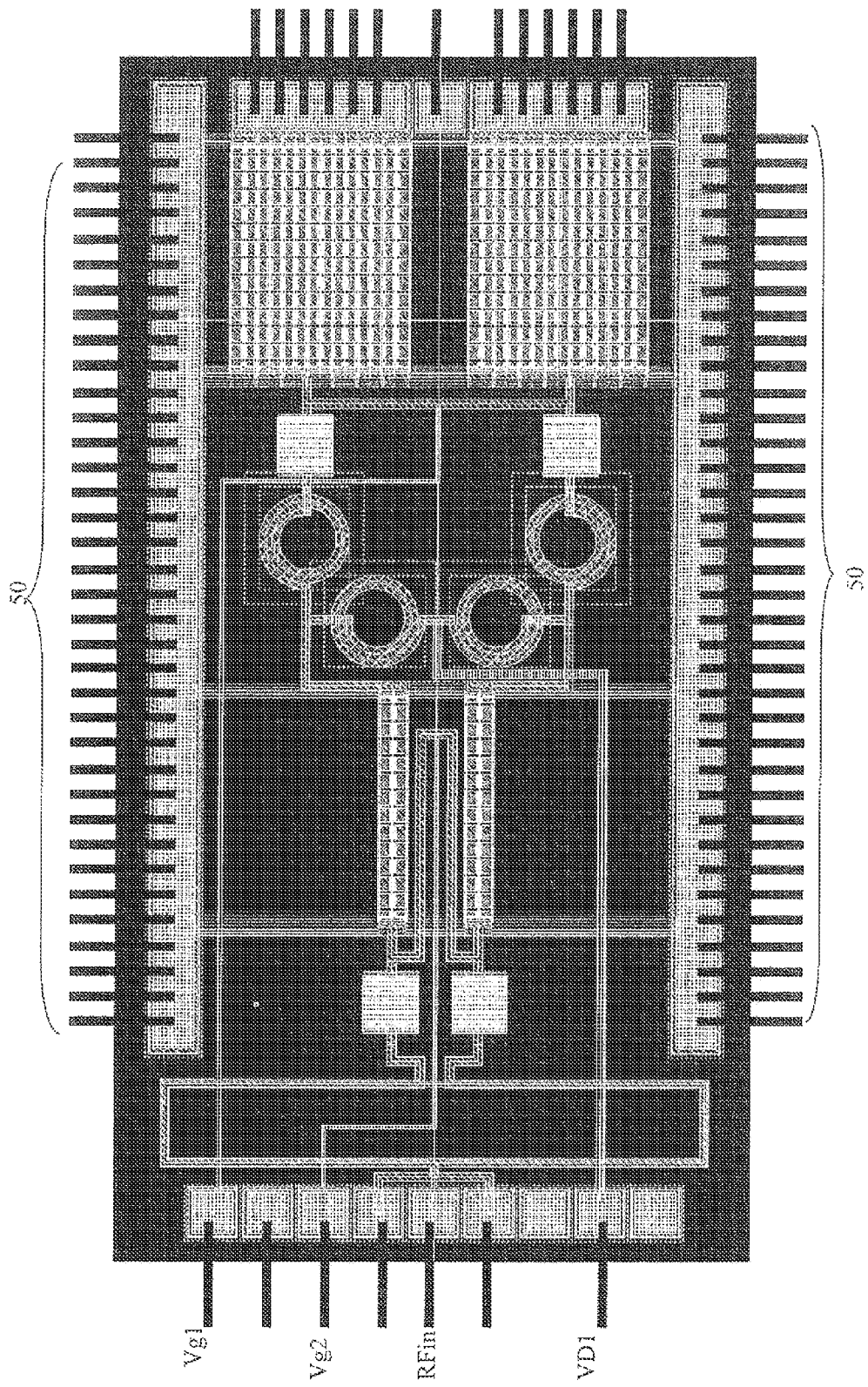
FIG. 2 is a plan view of a MMIC amplifier circuit according to an embodiment of the invention.

Turning to FIG. 2, there is shown a plan view of a MMIC amplifier circuit according to an embodiment of the invention. DC grounding connection of the field-effect transistors is provided by a plurality of wire bond connections 50. This grounding arrangement provides a short connecting inductance to the amplifier circuit.

In other embodiments, the DC grounding connection for the amplifier circuit may be provided via a large microstrip-like connection which has low impedance, and hence a small inductance in the pH range.

Figure 3:
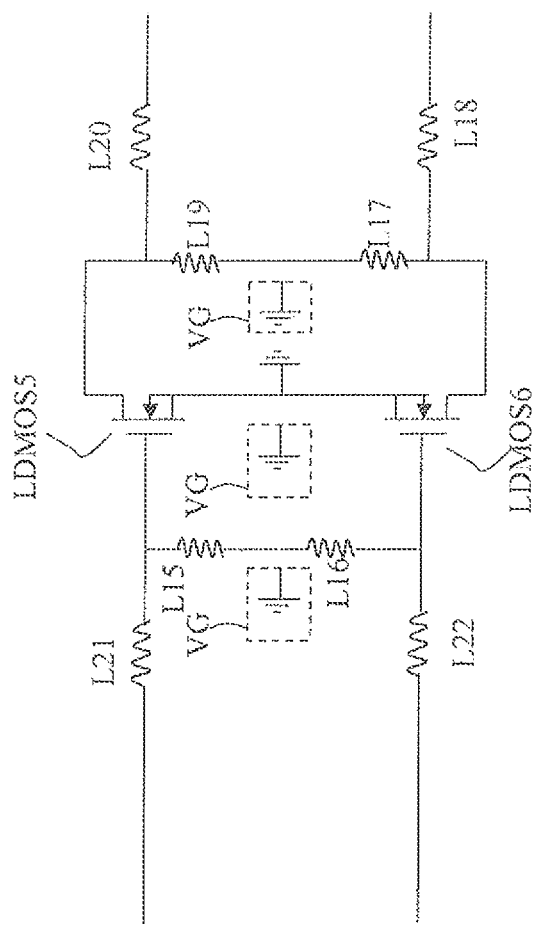
FIG. 3 is a schematic diagram of a final stage differential (i.e. push-pull) amplifier circuit 100 for a LDMOS amplifier according to an embodiment of the invention.

FIG. 3 is a schematic diagram of a final stage differential (i.e. push-pull) amplifier circuit 100 for a LDMOS amplifier according to an embodiment of the invention. Here, the circuit 100 is final stage push-pull amplifier: P3 dB 55 dBm/16 dB at P3 dB.

In the amplifier circuit, two sorts of ground connections are employed: the RF ground, which is provided by virtual ground(s) from the differential operation of the circuit; and the DC ground, which is provided by a physical grounding connection.

Figure 4:
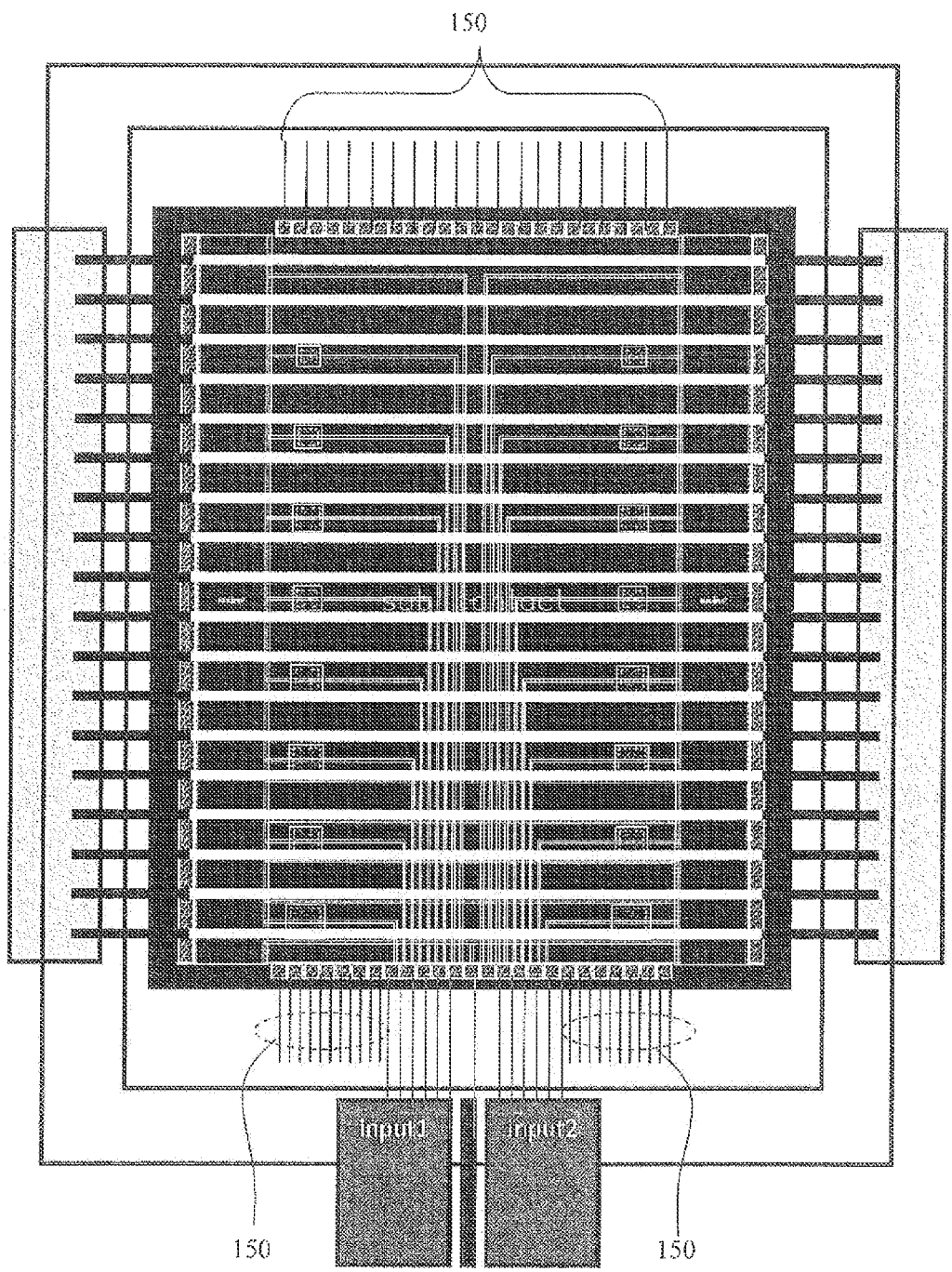
FIG. 4, there is shown a schematic plan view of packaged amplifier circuit according to an embodiment of the invention.

Turning to FIG. 4, there is shown a schematic plan view of packaged amplifier circuit according to an embodiment of the invention, wherein the packaging is removed to show the circuit and wire bond connections. DC grounding connection of the field-effect transistors is provided by a plurality of wire bond connections 150 connected to grounding pads of the circuit. This grounding arrangement provides a short connecting inductance to the amplifier circuit.

Figure 5A:
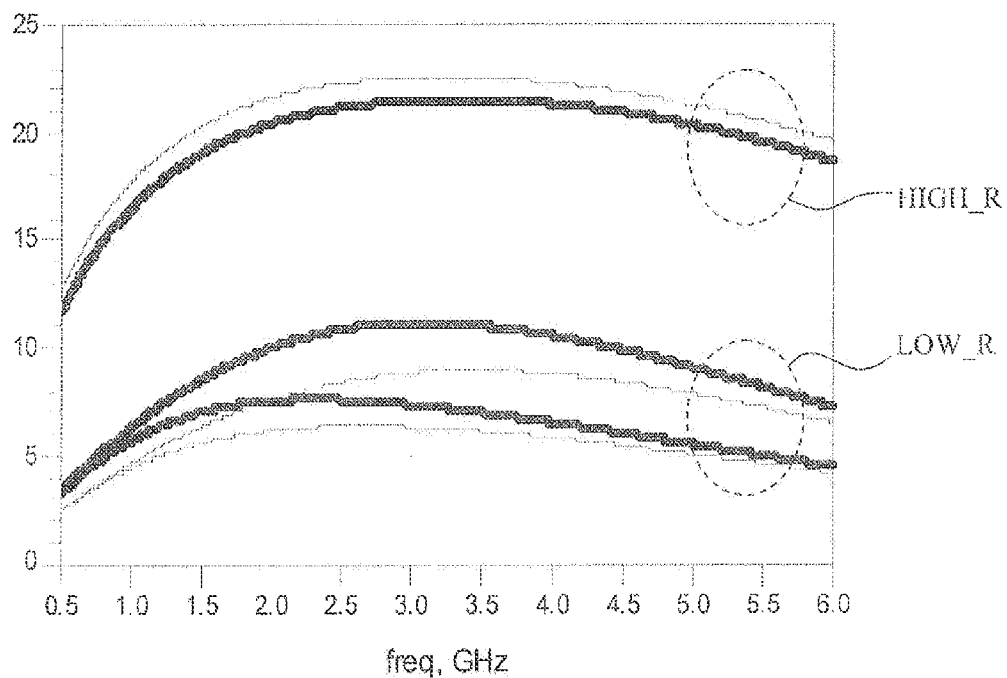
FIG. 5A is a graph illustrating a variation of the inductors Q with operating frequency for various conventional amplifier circuits employing a low resistivity substrate and for two amplifier circuits employing a high resistivity substrate according to an embodiment of the invention.

FIG. 5A is a graph illustrating a variation of the inductors Q with operating frequency for various conventional amplifier circuits employing a low resistivity (10 mΩ·cm) substrate (labelled "LOW_R") and for two amplifier circuits employing a high resistivity (1KΩ*cm) substrate (labelled "HIGH_R") according to an embodiment of the invention. From FIG. 5A it is seen that, across all operating frequencies, the amplifier circuits according to an embodiment of the invention have a higher Q value than the conventional amplifier circuits employing a low resistivity substrate. Indeed, for a given operating frequency, the amplifier circuits according to an embodiment of the invention have a Q value which is approximately twice that of the conventional amplifier circuits employing a low resistivity substrate.

Figure 5B:
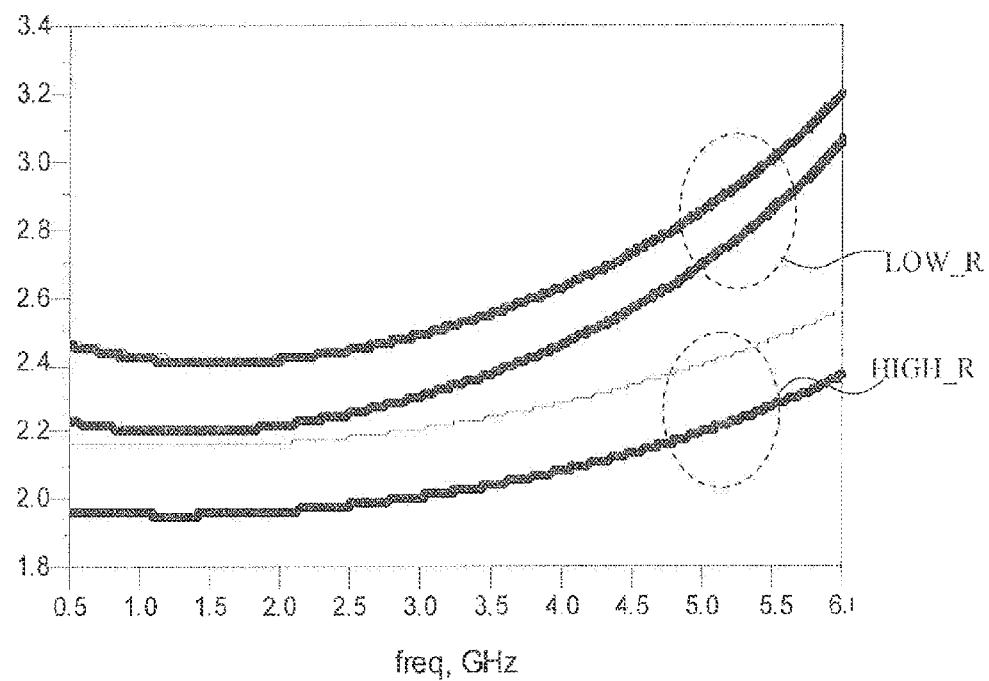
FIG. 5B is a graph illustrating a variation of the series inductance with operating frequency for various conventional amplifier circuits employing a low resistivity substrate and for amplifier circuits employing a high resistivity substrate according to an embodiment of the invention.

FIG. 5B is a graph illustrating a variation of the series inductance with operating frequency for various conventional amplifier circuits employing a low resistivity (10 mΩ·m) substrate (labelled "LOW_R") and for amplifier circuits employing a high resistivity (1KΩ*cm) substrate (labelled "HIGH_R") according to an embodiment of the invention. From FIG. 5B it is seen that, across all operating frequencies, the amplifier circuits according to an embodiment of the invention have a lower series inductance than the conventional amplifier circuits employing a low resistivity substrate.

Figure 5C:
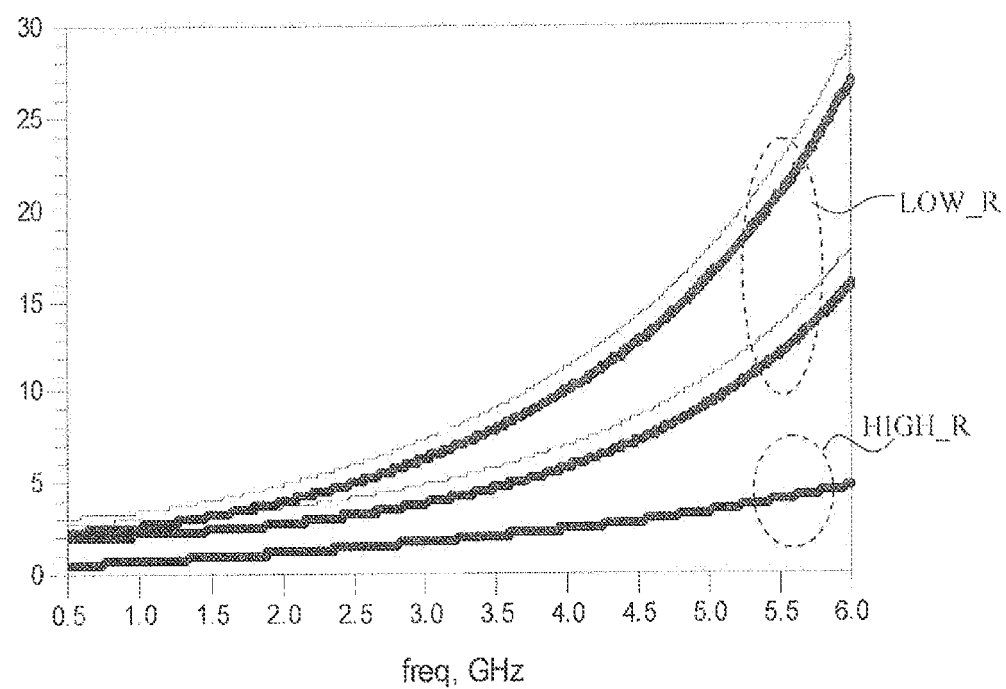
FIG. 5C is a graph illustrating a variation of the series resistance with operating frequency for various conventional amplifier circuits employing a low resistivity substrate and for amplifier circuits employing a high resistivity substrate according to an embodiment of the invention.

FIG. 5C is a graph illustrating a variation of the series resistance with operating frequency for various conventional amplifier circuits employing a low resistivity (10 mΩ·cm) substrate (labelled "LOW_R") and for amplifier circuits employing a high resistivity (1KΩ*cm) substrate (labelled "HIGH_R") according to an embodiment of the invention. From FIG. 5C it is seen that, across all operating frequencies, the amplifier circuits according to an embodiment of the invention have a lower series resistance than the conventional amplifier circuits employing a low resistivity substrate.

From FIGS. 5A-5C it will be seen that the series resistance and the series inductance of embodiments of the invention employing a high resistivity substrate is significantly reduced when compared to conventional amplifier circuits employing a low resistivity substrate. Embodiments employing the described concept of splitting the AC and DC ground connections may therefore provide improvement in the maximum frequency and power performance roll-off of an active device and significant improvement in passive devices (such as inductors and transmission lines, for example). Furthermore, such embodiments may not require thru-substrate vias for ground connection, thereby avoiding the need for expensive via fabrication processes.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality.

The invention claimed is:

1. A differential amplifier circuit for an LDMOS-based amplifier, the circuit comprising a high resistivity substrate and separate DC and AC ground connections that do not require thru-substrate vias.

2. The circuit of claim 1, wherein the AC ground connection comprises a virtual ground connection.

3. The circuit of claim 2, wherein the circuit comprises first and second transistors, the source of the first transistor being electrically connected to the source of the second transistor by a source-to-source connection, and wherein the virtual ground connection is provided by the source-to-source connection.

4. The circuit of claim 3, wherein the source-to-source connection is formed from an intermediate layer of metal.

5. The circuit of claim 1, wherein the DC ground connection comprises a plurality of wire bond connections or a microstrip connection.

6. The circuit of claim 1, wherein the high resistivity substrate comprises silicon.

7. The circuit of claim 1, wherein the high resistivity substrate has a resistivity greater than 50 $\Omega$*cm.

8. The circuit of claim 7, wherein the high resistivity substrate has a resistivity greater than 100 $\Omega$*cm.

9. The circuit of claim 7, wherein the high resistivity substrate has a resistivity greater than or equal to 1 K$\Omega$*cm.

10. An LDMOS amplifier circuit comprising a differential amplifier circuit according to claim 1.

11. A packaged high-power radio frequency, RF, amplifier circuit comprising:
an amplifier circuit according to claim 1.

12. An integrated circuit comprising an amplifier circuit according to claim 1.

13. A mobile base station comprising an amplifier circuit according to claim 1.

\* \* \* \* \*